US006480136B1

(12) United States Patent
Kranz et al.

(10) Patent No.: US 6,480,136 B1
(45) Date of Patent: Nov. 12, 2002

(54) MODIFIED REPETITIVE CELL MATCHING TECHNIQUE FOR INTEGRATED CIRCUITS

(75) Inventors: Rodney Louis Kranz, Cambridge, MA (US); Charles D. Lane, Greensboro, NC (US); David Jarman, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/851,658

(22) Filed: May 8, 2001

(51) Int. Cl.[7] .................... H03M 1/06; H03M 1/36
(52) U.S. Cl. ........................ 341/159; 341/118
(58) Field of Search ........................ 341/155, 156, 341/158, 159, 118, 120; 714/47; 716/4

(56) References Cited

U.S. PATENT DOCUMENTS

| | | | | |
|---|---|---|---|---|
| 4,309,768 A | * | 1/1982 | Ault .................. | 714/47 |
| 5,175,550 A | | 12/1992 | Kattmann et al. ........ | 341/159 |
| 5,835,048 A | | 11/1998 | Bult .................. | 341/159 |
| 6,014,098 A | | 1/2000 | Bult et al. ............ | 341/158 |
| 6,100,836 A | | 8/2000 | Bult .................. | 341/155 |
| 6,161,213 A | * | 12/2000 | Lofstrom .............. | 716/4 |
| 6,169,510 B1 | | 1/2001 | Bult et al. ............ | 341/155 |
| 6,204,794 B1 | | 3/2001 | Bult .................. | 341/155 |
| 6,356,225 B1 | * | 3/2002 | Johnstone et al. ...... | 341/155 |

OTHER PUBLICATIONS

M. Choi & A. Abidi, "A6b 1.3GSample/s A/D Converter in 0.35 $\mu$m CMOS," IEEE ISSCC Digest of Technical Papers, p. 126–127 and Visuals Supplement, pp. 96–97, 405, IEEE, 2001.

* cited by examiner

Primary Examiner—Patrick Wamsley
(74) Attorney, Agent, or Firm—Iandiorio & Teska

(57) ABSTRACT

An integrated circuit including a number of repetitive cells for producing output signals in response to respective inputs, each cell having associated with it an output circuit responsive to the cell output signal to produce an output circuit output signal, each of the output circuits including a circuit device having two terminals to provide for the flow therethrough of a current from an associated current supply and producing a corresponding output signal; the improvement for reducing the effects of cell mismatch and output circuit mismatch including an impedance network, having a set of impedance elements each connected between corresponding terminals or respective pairs of the circuit devices with each circuit device forming a part of a respective output circuit, the impedance elements reducing the effects of cell mismatch and output circuit mismatch on the output signals; there maybe one impedance network which accommodates mismatches in both the cells and output circuits or there may be one impedance network to accommodate cell mismatch and another to accommodate output circuit mismatch.

2 Claims, 3 Drawing Sheets

MODIFIED REPETITIVE CELL MATCHING TECHNIQUE FOR INTEGRATED CIRCUITS

FIELD OF INVENTION

This invention relates to an integrated circuit having repetitive cells with repetitive output circuits designed to be matched for proper, accurate circuit operation, and more particularly to such an integrated circuit having means to reduce the adverse effects of output circuit mismatch as well as cell mismatch.

BACKGROUND OF INVENTION

There are many integrated circuits which include a large number of repetitive cells designed to perform in matched fashion so as to assure specified circuit performance. Such cells often include impedance elements such as resistors which are for example supplied by current sources to produce corresponding output signals. Analog-to-digital (A/D) and digital-to-analog (D/A) converters are examples of devices which frequently incorporate such repetitive cells.

One problem which often arises with such integrated circuits is that in a practical device the actual match between cells turns out to be less than wanted, so that the device performance is less than satisfactory. For example, in A/D converters of the flash type, mismatch between repetitive cells typically forming part of the comparators conventionally used in such converters will adversely affect the differential and integral linearity of the outputs. Thus, in any group of processed monolithic chips having such integrated circuits, the number of parts meeting specifications for high-grade performance may be much smaller than desired due to random mismatches caused by small deviations from nominal in the parameters of some of the circuit elements. Attempts have been made to solve this problem of mismatch between repetitive cells in an integrated circuit.

In one approach, the cells all include resistors (of equal ohmic value) carrying currents (designed to be of equal value) producing corresponding output signals. To avoid the effects of cell mismatch on the output signals, a network of equal-valued resistors is added to the circuit, with each network resistor connected between corresponding ends of adjacent pairs of the cell resistors as disclosed in U.S. Pat. No. 5,175,550. This works well with respect to accommodating for cell mismatches, but in actual application each cell has associated with it one or a pair of output circuits such as a level shifting circuit or a driver circuit which also must be properly matched in order to obtain desired precision.

BRIEF SUMMARY OF THE INVENTION

It is therefore an object of this invention to provide an integrated circuit which reduces the adverse effect of output circuit mismatch as well as cell mismatch.

It is a further object of this invention to provide such an integrated circuit which reduces the adverse effect of output circuit mismatch as well as cell mismatch with few additional components.

It is a further object of this invention to provide such an integrated circuit which reduces the adverse effect of output circuit mismatch as well as cell mismatch with a simple impedance network.

The invention results from the realization that the adverse effects of both cell mismatch and associated output circuit mismatch in a repetitive cell integrated circuit can be reduced using an impedance to form circuitry which modifies the effective output of the cell and of the output circuit.

This invention features an integrated circuit including a number of repetitive cells for producing output signals in response to respective inputs. Each of the cells includes a circuit element having two terminals to provide for the flow therethrough of a current from an associated current source and producing a corresponding cell output signal. An impedance network includes a set of impedance elements each connected between the corresponding terminals of respective pairs of the circuit elements with each circuit element of the pairs forming part of respective cell. The impedance elements permit the flow of current therethrough to reduce the effects of cell mismatch on the output signals. An output circuit is associated with each cell; each output circuit includes a circuit device having two terminals to provide for the flow therethrough of a current from an associated current supply and produces a corresponding output signal. The improvement for reducing the effects of output circuit mismatch includes a second impedance network having a second set of impedance elements each connected between corresponding terminal of respective pairs of the circuit devices, with each circuit device of such pairs forming part of a respective output circuit. The second impedance elements permit the flow of current therethrough to reduce the effects of output circuit mismatch on the output signals.

This invention also features an integrated circuit including a number of repetitive cells for producing output signals in response to respective inputs. Each cell has associated with it an output circuit responsive to the cell output signal to produce an output circuit output signal. Each of the output circuits includes a circuit device having two terminals to provide for the flow therethrough of a current from an associated current supply and produces a corresponding output circuit output signal. The improvement for reducing the effects of cell mismatch and output circuit mismatch includes an impedance network having a set impedance elements each connected between corresponding terminals of respective pairs of the circuit devices. Each circuit device of such pairs forms a part of a respective output circuit. The impedance elements reduce the effects of cell mismatch and output circuit mismatch on the output signals.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
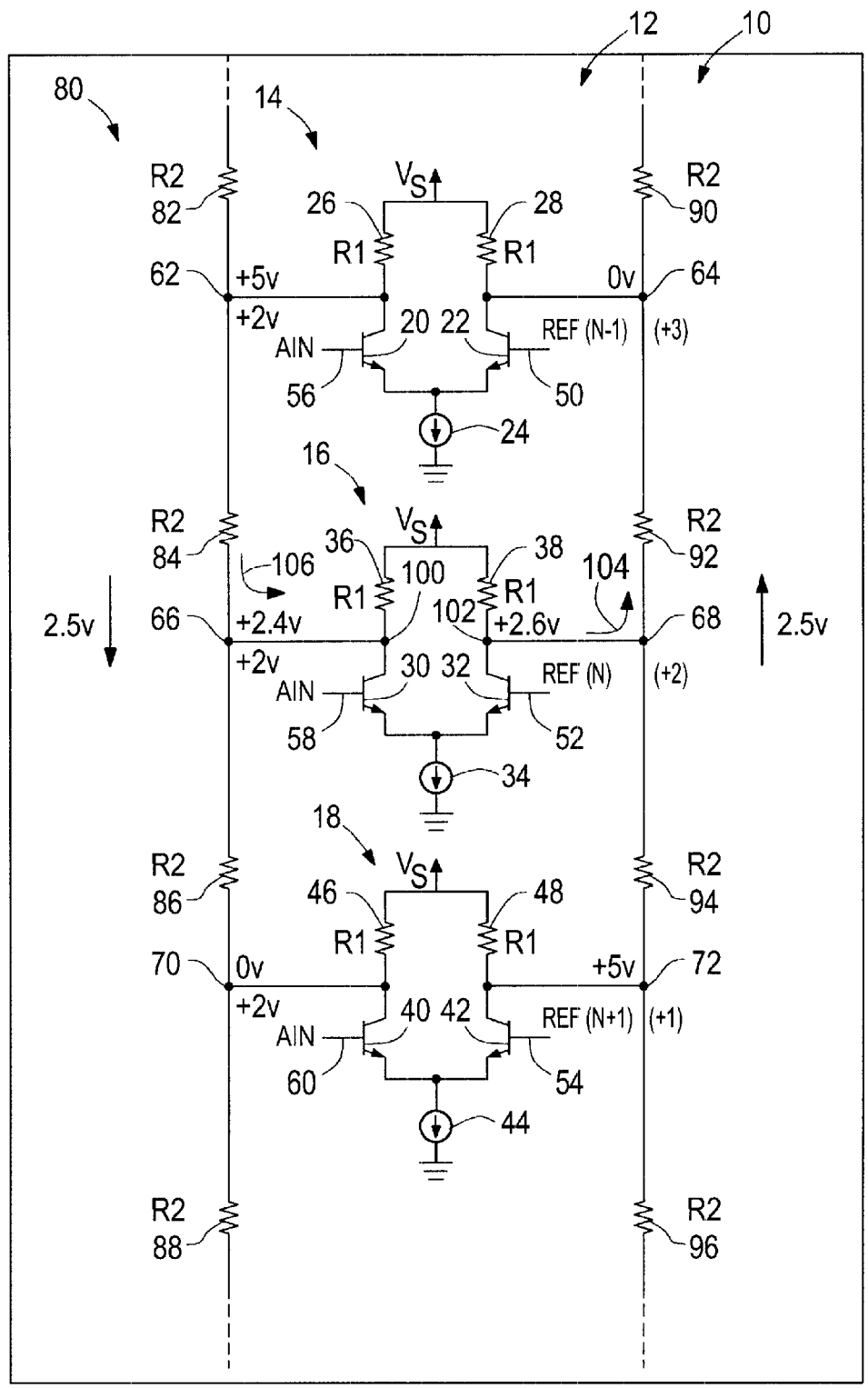
FIG. 1 is a schematic diagram showing elements of repetitive cells on an integrated circuit of a monolithic chip together with an additional resistor network according to the prior art for reducing the effects of cell mismatch.

There shown in FIG. 1, cells 14, 16, and 18 such as, for example, preamplifiers or comparators used for flash converters. Each cell 14, 16, and 18 includes a number of circuit elements such as transistors 20 and 22 and current source 24. Also included are a pair of resistors 26 and 28. Although only three cells are shown in FIG. 1, normally there are many more than that. In order for the flash converter to work accurately, transistors 20 and 22 must be identical as must resistor 26 and 28. In addition, the circuit elements must be identical to those of every other cell, so transistors 30 and 32 in cell 16 must be identical with each other and with transistors 20 and 22 in cell 14. Current source 34 must be identical with current source 24 and resistors 36 and 38 in addition to being identical with each other should be identical to resistors 26 and 28. Likewise in cell 18, transistors 40 and 42 must be identical to each other and to transistors 20, 22, and 30 and 32; current source 44 must be identical to current sources 34 and 24 and resistors 46 and 48 must be identical to each other and to resistances 26, 28, 36 and 38.

Viewing integrated circuit 12 as a portion of a flash converter, the inputs 50, 52 and 54 to transistors 22, 32, and 42 respectively, represent reference inputs, reference 50 being (n−1), reference 52 being (n), and reference 54 being (n+1). The other input to transistors 20, 30 and 40 is the single input presented at 56, 58 and 60. For illustrative purposes, assume that the reference 54 is +1 volt, that reference 52 is +2 volts and that reference 50 is +3 volts. Then assuming an input of 2.5 volts which appears at all inputs 56, 58 and 60, cell 14 will sense that the 2.5 volts at input 56 is lower than the +3 volts at input 50. This causes point 62 to go high to +5 volts and point 64 to go low to 4 volts. A similar thing occurs with cell 16 with point 68 going high to +5 volts and point 66 going low to 4 volts and with cell 18 with point 72 going to +5 volts and point 70 going to 4 volts. This, of course, is assuming that all of the circuit elements in each of the cells is balanced and identical with one another. Assuming for the sake of example that cell 16 has mismatched elements in it, and also assume that the input signal is 2 volts, then cell 14 will indicate that the input signal of 2 volts is less than its reference voltage of 3 volts and point 62 will go to +5 volts with point 64 going to 4 volts again. Skipping down to cell 18, since 2 volts at input 60 is greater than the +1 reference voltage at 54, point 70 will go to 4 volts and point 72 will go to +5 volts. Assuming further that point 60 has imbalanced circuit elements in it, it will switch between going high and going low at the wrong point and will cause an inaccuracy in the converter output.

In order to remove the adverse effects of such mismatched elements, the prior art device shown in FIG. 1 adds an impedance network 80 including identical resistances 82, 84, 86, 88, 90, 92, 94, and 96. Now with cell 14 switched one way and cell 18 switched the opposite way and cell 16 electrically isolated from the resistor ladder (i.e., no connection between points 102 and 68 and between points 100 and 66), there is 4 volts at point 64, +5 volts at point 72, and at point 68 it will be 4.5 volts since resistors 92 and 94 are equal. Similarly, since point 62 is gone to +5 volts and point 70 has gone to 4 volts, point 66 is also at 4.5 volts. Now assume that element mismatches in cell 16 result in setting the voltage at point 100 to 4.4 volts and the voltage at point 102 to 4.6 volts.

Now assume that cell 16 is electrically connected to the resistor ladder (i.e., points 102 and 68 are connected and points 100 and 66 are connected). With this situation, since the voltage at point 102 is higher than the voltage of point 68, current will flow outward as shown by arrow 104 from point 102. In contrast, as shown by arrow 106, the current will flow into point 100 because its value of 4.4 is below the value of 4.5 at point 66. It is this current flow that reduces the adverse effects of mismatched circuit elements. A further explanation of this including construction, operation, and theory is shown more filly in U.S. Pat. No. 5,175,550 incorporated herein by reference in its entirety.

Figure 2:
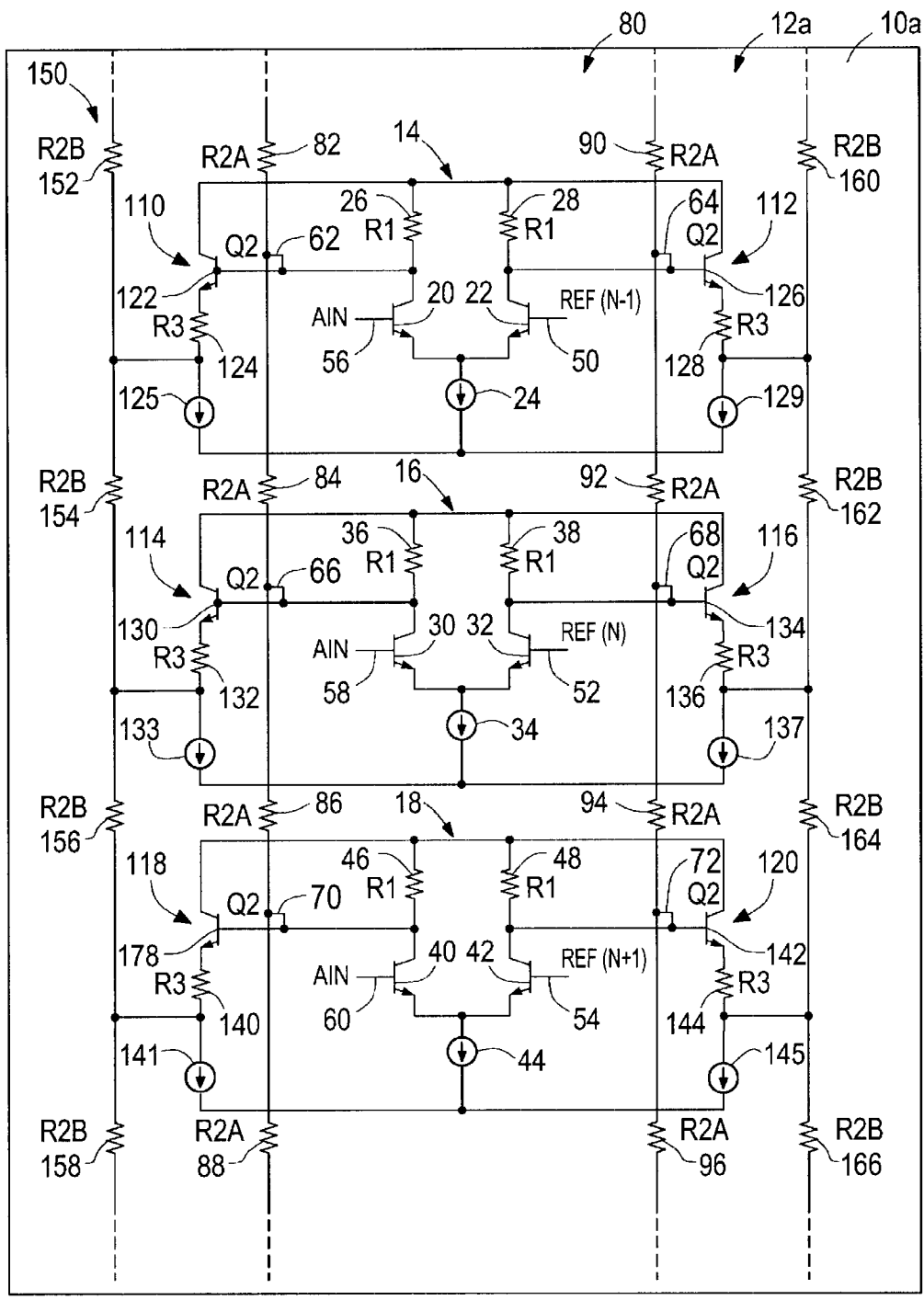
FIG. 2 is a schematic diagram similar to that shown in FIG. 1 with an additional impedance network for reducing the effects of output circuit mismatch.

In some applications, cells 14, 16 and 18 are accompanied by output circuits 110, 112, 114, 116, 118, and 120, FIG. 2. Each output circuit may include one or more circuit devices such as transistor 122, resistance 124 and current supply 125, in output circuit 110; transistor 126, resistance 128 and current supply 129 in output circuit 112; transistor 130, resistance 132 and current supply 133 in output circuit 114; transistor 134, resistance 136 and current supply 137 in output circuit 116; transistor 138, resistance 140 and current supply 141 in output circuit 118; and transistor 142, resistance 144 and current supply 145 in output circuit 120. Although shown separately, output circuits 110 and 112 may constitute a single output circuit as referred to hereinafter. So to output circuits 114 and 116 and output circuits 118 and 120. In order to adjust for the adverse effects of imbalances in these circuit devices 122–144, a second impedance network 150 including resistances 152, 154, 156, 158, 160, 162, 164, and 166 is provided in accordance with this invention. This second impedance network 150 operates to accommodate for imbalances in output circuits 110–120 in the same way that the first impedance network 80 compensates for imbalances in the cells.

Figure 3:
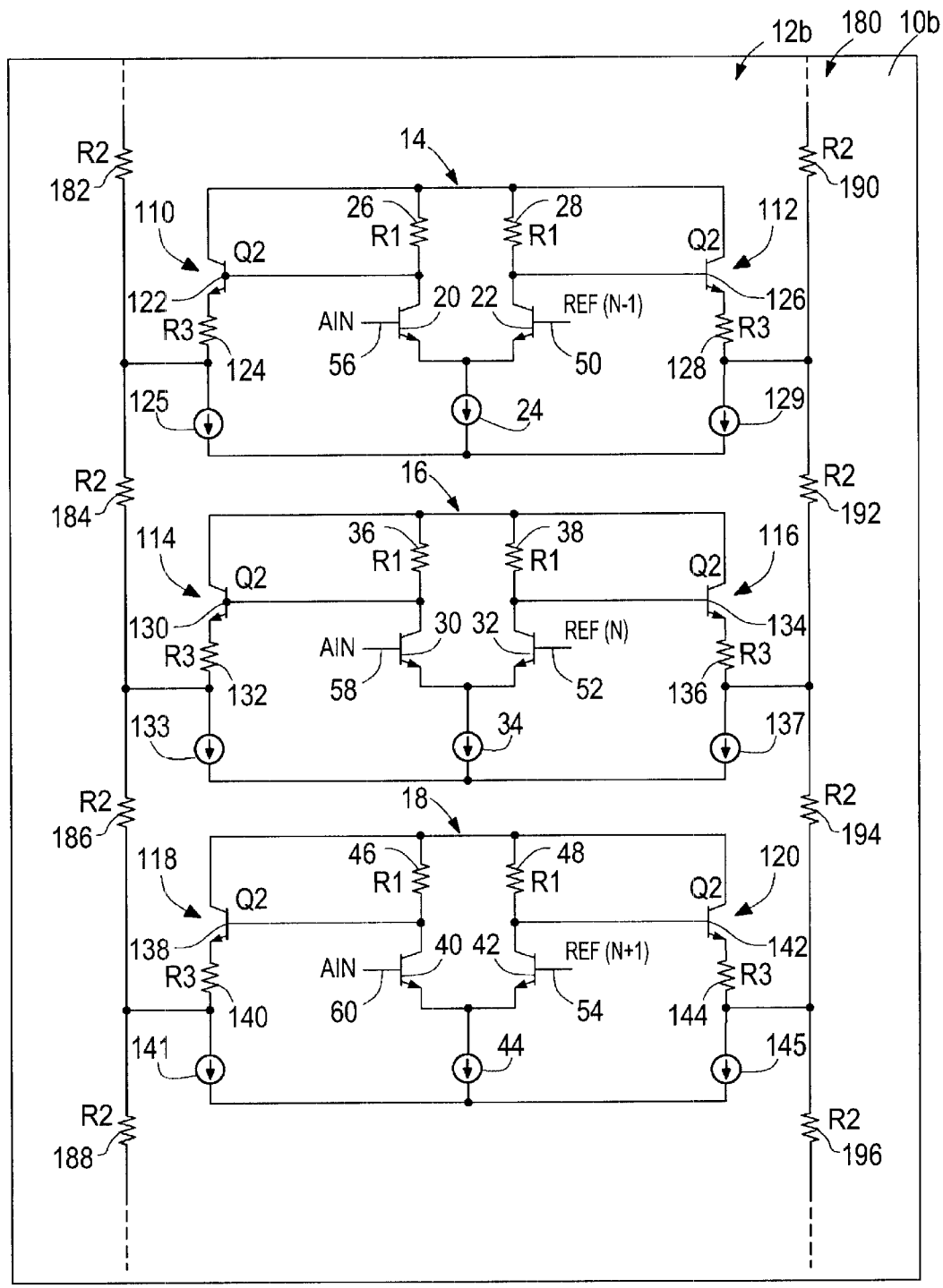
FIG. 3 is a schematic diagram similar to FIG. 2 but using only a single resistor network to compensate for the mismatch of the output circuits as well as the mismatch of the cells.

In another embodiment of even simpler design both the cells 14, 16, and 18 and the output circuits 110, 112; 114, 116; and 118, 120 can be compensated for any mismatches by a single impedance network 180, FIG. 3 which includes resistances 182, 184, 186, 188, 190, 192, 194, and 196. Thus, the network comprised of resistors 182–196 serves to supply current to or sink current away from any cell and its associated output circuit in which there is an imbalance or a mismatch, whether it be due to mismatches of circuit elements in the cell or mismatches of circuit devices in the output circuits. Although thus far the embodiments have been shown with the impedance networks implemented with resistances, this is not a necessary limitation of the invention as other impedances such as capacitances can be used. Furthermore, the invention is not limited to circuits using bipolar junction transistors as it applicable to circuits using any kind of transistor circuits, for example, MOSFET types of devices.

Although the embodiments described herein have been disclosed as including output circuits, it would be understood by one skilled in the area of integrated circuits have repetitive cells that the term output circuits includes, for example, second stage amplifier circuits, latch circuits, and output driver circuits (such as shown at 110, 112 in FIG. 2).

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. In an integrated circuit including a number of repetitive cells for producing output signals in response to respective inputs, each of said cells including a circuit element having two terminals to provide for the flow therethrough of a current from an associated current source and producing a corresponding cell output signal and an impedance network including a set of impedance elements each connected between the corresponding terminals of respective pairs of said circuit elements, with each circuit element of said pairs forming part of a respective cell, said impedance elements permitting the flow of current therethrough to reduce the effects of cell mismatch on said output signals and an output circuit associated with each cell, each output circuit including a circuit device having two terminals to provide for the flow therethrough of a current from an associated current supply and producing a corresponding output circuit output signal, the improvement for reducing the effects of output circuit mismatch comprising:

a second impedance network including a second set of impedance elements each connected between corresponding terminals of respective pairs of said circuit devices, with each circuit device of such pairs forming part of a respective output circuit, the second impedance elements permitting the flow of current therethrough to reduce the effects of output circuit mismatch on the output signals.

2. In an integrated circuit including a number of repetitive cells for producing output signals in response to respective inputs, each cell having associated with it an output circuit responsive to said cell output signals to produce an output circuit output signal, each of said output circuits including a circuit device having two terminals to provide for the flow therethrough of a current from an associated current supply and producing a corresponding output circuit output signal, the improvement for reducing the effects of cell mismatch and output circuit mismatch comprising:

an impedance network including a set of impedance elements each connected between corresponding terminals of respective pairs of said circuit devices, with each circuit device of such pairs forming a part of a respective output circuit, said impedance elements reducing the effects of cell mismatch and output circuit mismatch on the output signals.

* * * * *